United States Patent [19]

Greene et al.

[11] Patent Number: 5,519,399
[45] Date of Patent: May 21, 1996

[54] METHOD FOR MEASURING THE FREQUENCY OF CONTINUOUS WAVE AND WIDE PULSE RF SIGNALS

[75] Inventors: Elliott J. Greene, Union; Pei-Hwa Lo, Ramsey, both of N.J.

[73] Assignee: AlliedSignal Inc., Morris Township, N.J.

[21] Appl. No.: 347,992

[22] Filed: Dec. 5, 1994

[51] Int. Cl.$^6$ ............................................. G01S 7/38
[52] U.S. Cl. ........................... 342/14; 342/15; 342/196; 324/76.24
[58] Field of Search ............................. 342/13, 14, 15, 342/192–196, 42, 51; 324/76.23, 76.24

[56] References Cited

U.S. PATENT DOCUMENTS

| | | | |
|---|---|---|---|
| 3,524,201 | 8/1970 | Land, Jr. | 342/51 |
| 3,706,095 | 12/1972 | Cherwek | 343/7.7 |
| 3,758,763 | 9/1973 | Nohara et al. | 235/151.31 |
| 3,845,482 | 10/1974 | Jirousek et al. | 342/14 |
| 4,045,797 | 8/1977 | Krage | 348/8 |
| 4,121,211 | 10/1978 | Cusack | 343/14 |
| 4,282,524 | 8/1981 | Eymann et al. | 343/14 |
| 4,324,258 | 4/1982 | Huebscher et al. | 128/663 |
| 4,412,219 | 10/1983 | Briggs | 342/51 X |
| 4,799,020 | 1/1989 | English | 324/76.43 |
| 4,845,685 | 7/1989 | Wechsler et al. | 367/97 |
| 4,858,142 | 8/1989 | Jenq et al. | 364/487 |
| 4,944,189 | 7/1990 | Nakajima et al. | 73/861.25 |
| 5,038,096 | 8/1991 | Obie et al. | 324/76.23 |
| 5,269,308 | 12/1993 | Hagiwara et al. | 128/661.09 |
| 5,301,210 | 4/1994 | Vandamme et al. | 375/83 |
| 5,329,253 | 7/1994 | Ichihara | 331/17 |

*Primary Examiner*—Charles T. Jordan
*Assistant Examiner*—Christopher K. Montgomery
*Attorney, Agent, or Firm*—Verne E. Kreger, Jr.

[57] ABSTRACT

A method for measuring the frequency of continuous wave and wide pulse RF signals using multi-purpose, commercial-off-the-shelf test devices, such as an RF signal down converter, a digitizer and a signal processor. The method is based on digitizing the RF signals and dividing the digitized data into blocks of discrete data points. An initial estimated frequency is calculated for the first block of data and used to generate a synthetic signal. The synthetic signal and individual block of data under analysis are summed and tested by a discrimination function through an iteration process to arrive at an estimated frequency for each block of data points. The results are averaged to arrive at the final calculated frequency for the RF signal. The method is suitable for real-time calculations of the RF signal frequency.

8 Claims, 5 Drawing Sheets

- $f_s$ = SAMPLING FREQUENCY
- $f_a$ = ACTUAL INPUT FREQUENCY
- $f_e$ = ESTIMATED FREQUENCY
- $\Phi_a$ = ACTUAL INPUT PHASE
- $\Phi_e$ = ESTIMATED 180° OUT-OF-PHASE

METHOD FOR MEASURING THE FREQUENCY OF CONTINUOUS WAVE AND WIDE PULSE RF SIGNALS

BACKGROUND OF THE INVENTION

1. Field of the Invention

The present invention relates to RF signals, and more particularly to an inexpensive method of measuring the frequency of Continuous Wave and Wide Pulse RF signals in real-time or near real-time.

2. Description of Related Art

Radar and electronic counter measure (ECM) systems commonly employ continuous wave (CW) or wide pulse (pulses with widths >5 microsec) RF signals. The frequency of such an RF signal emitted by these systems is an important characteristic that must be accurately measured to assess a system's performance.

The conventional method for measuring RF frequency is to use expensive equipment such as electronic counters, spectrum analyzers, synchronous detectors and digital frequency discriminators. Microwave counters EIP 1230A and 1231A manufactured by EIP Microwave, Inc. and the Hewlett Packard electronic counter HP 5361B are examples of instruments currently in use to measure RF frequencies. These instruments, however, are expensive, bulky and require specialized hardware. They also do not provide the required frequency measurement accuracy for state-of-the-art radar and ECM systems. The accuracy required for these systems is often <100 hertz for signals with frequencies of up to 40 gigahertz.

SUMMARY OF THE INVENTION

The developed technique uses standard test devices such as an RF signal down converter, a digitizer, and a signal processor to achieve the same or better measurement accuracy as more expensive frequency measurement devices. Because these standard test devices are multi-purpose, commercial off-the-shelf equipment, the cost of implementing the invention is low.

The method for measuring the frequency of continuous wave or wide pulse RF signals comprises down convening the RF signal to a signal having an intermediate frequency and then digitizing the intermediate frequency signal. The digitized signal is divided into blocks of discrete data points. The first block of data points is processed to calculate an initial estimated frequency representative of the RF signal. The initial estimated frequency is used as the starting point to calculate the frequency of the individual remaining blocks of discrete data points through an iteration process. Generally, the iteration process includes generating a synthetic signal as a function of the initial estimated frequency and the block of discrete data points under analysis and summing the synthetic signal and data to produce a sum signal. A discrimination function tests the sum signal for a particular characteristic, such as monotonicity or minimum value. A positive and/or negative incremental frequency value is added to the initial estimated frequency to create a new estimated frequency, and the incremental frequency value is reduced in magnitude and tested against a threshold value. If the incremental value is greater than the threshold value then a new synthetic signal is generated as a function of the new estimated frequency and the data points under analysis. The new synthetic signal and data points are summed and tested using the same discrimination function. The iteration process continues until the incremental value is below the threshold, and the frequency calculated in that particular loop is the calculated final frequency for that data block under analysis. The same procedure continues for the remaining blocks of data points. The final calculated frequency for the RF signal is the average of the frequencies calculated for all of the data blocks.

The objective of this invention is to provide an innovative CW/Wide Pulse RF frequency measurement technique using low cost commercial off-the-shelf test equipment. The invention measures the frequency of RF signals with a high degree of accuracy using only the RF signal output of the unit under test (UUT) as the input to the invention.

BRIEF DESCRIPTION OF THE DRAWINGS

The above and other objects and advantages of this invention will be apparent on consideration of the following detailed description, taken in conjunction with the accompanying drawings, in which like reference characters refer to like parts throughout, and in which.

DETAILED DESCRIPTION OF THE INVENTION

The following detailed description, which describes only the preferred embodiment of the invention, is understood only to be an illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

Figure 1:
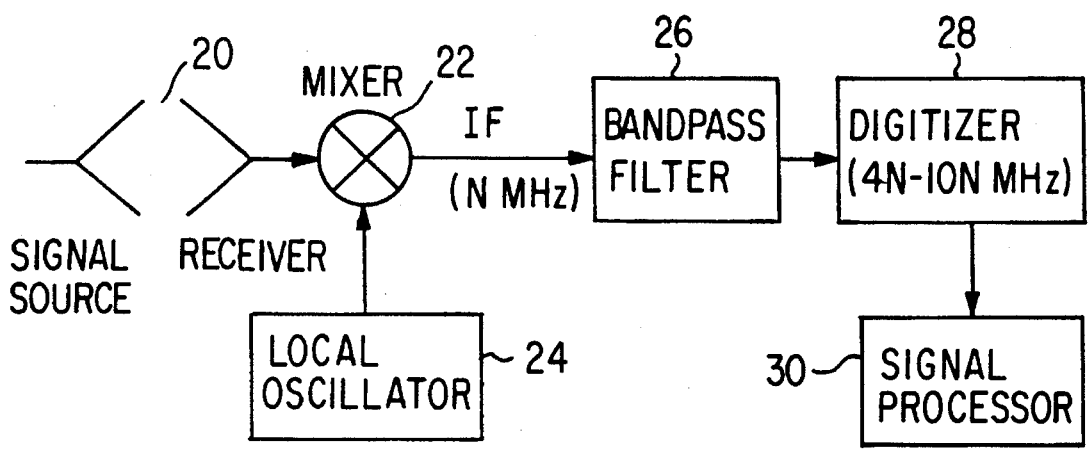
FIG. 1 is a block diagram of the RF signal acquisition procedure.

FIG. 1 illustrates the signal acquisition mechanism of the invention. The RF signal (CW or wide pulse) generated by the UUT is frequency down converted to an intermediate frequency (IF). Mixer 22 receives both the test signal from source 20 and a control frequency generated by a local oscillator 24. Mixer 22 outputs an IF signal as the difference between the frequencies (i.e. Frequency$_{RF}$–Frequency$_{control}$=IF). The IF signal passes through bandpass filter 26 to remove unwanted high frequency components. The IF signal is sampled by a digitizer 28 and transferred to a signal processor 30 to perform frequency analysis. The preferred IF is approximately from between 10 percent to about 25 percent of the sampling frequency of digitizer 28.

Figure 2:
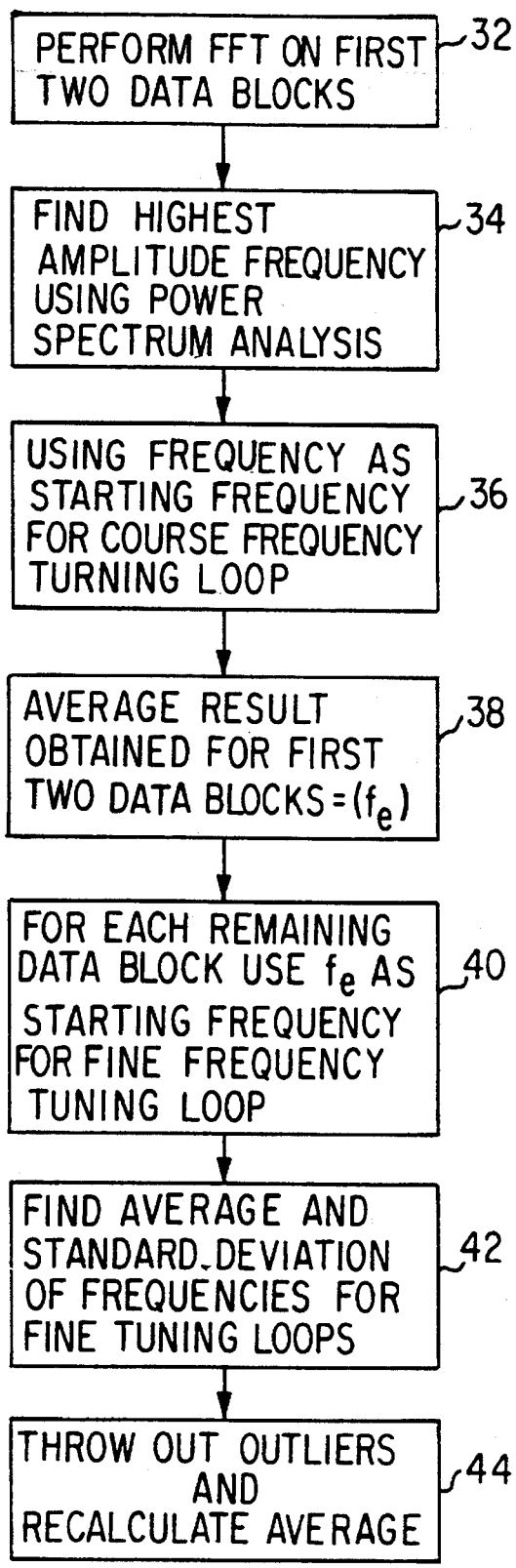
FIG. 2 is a flow diagram of a first embodiment for calculating the frequency of continuous wave or wide pulse RF signals.

In one embodiment, the acquired data from digitizer 28 is divided into blocks of data points, preferably 512 data points per block. The blocks of date serve as the input to the frequency measurement algorithm, shown in FIG. 2. The first two data blocks are used to derive an initial estimate of the input RF signal frequency, $f_{e\ initial}$. This is accomplished by performing a Fast Fourier Transform (FFT) on each of the first two data blocks 32, and a power spectrum analysis 34 of the result yields the starting frequency estimate for the coarse tuning loop 36, described below. The tuning loop first calculates a coarse frequency for each of the first two data blocks. The average of the two coarse frequencies 38 is used as the initial frequency estimate $f_e$ for the fine tuning loop which more finely calculates the frequency of the remaining data blocks 40. The final frequency measurement is the average of the results of the fine tuning loops for many data blocks, after rejection of outliers (where outliers are >2 standard deviations) 42 and 44.

Figure 3:
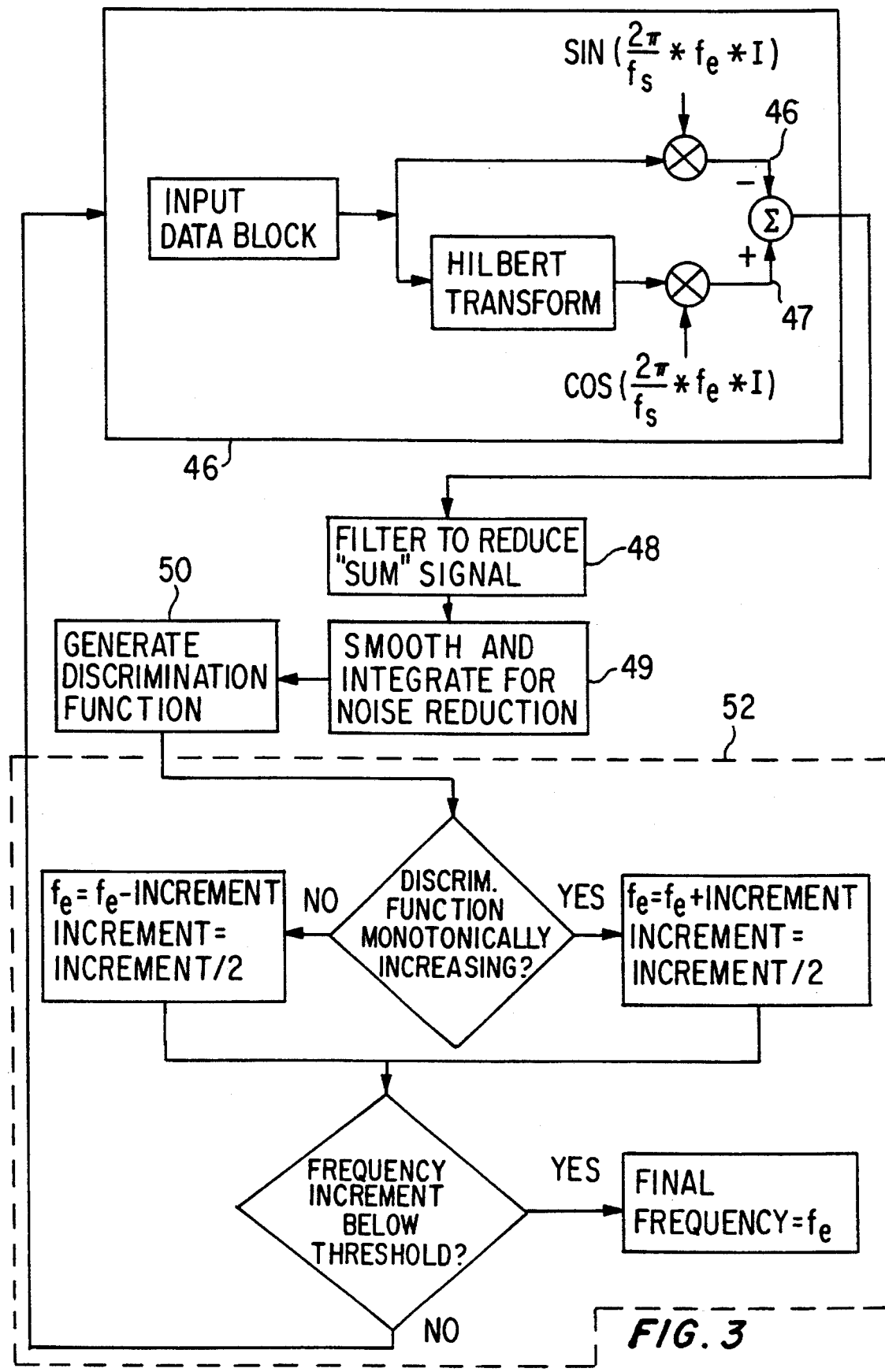
FIG. 3 is a flow diagram of a coarse and fine tuning loop.

The coarse and fine tuning loops are both graphically illustrated in FIG. 3 and differ only in the source of the starting frequency and the range over which the binary search is performed. The coarse tuning loop uses as its starting frequency the frequency calculated at 36. The fine tuning loop uses $f_e$, determined in step 38.

In operation, the tuning loops each receive individual blocks of data and omit all data points preceding the first maximum data point thereby representing the block of data as a cosine function represented by:

$$\cos((2\pi*(f_e+\delta)*I)/f_s) \quad (1)$$

where $f_s$ is the sampling frequency, $f_e$ is the estimated frequency, $\delta$ is the frequency error estimate and I is the block data input. The signal is further down converted to a very low frequency (near DC) comprising an in-phase component 46 and a quadrature component 47. The in-phase component 46 consists of multiplying the cosine function defined by equation (1) by a synthetic signal characterized by:

$$\sin(2\pi*f_e*I/f_s) \quad (2)$$

resulting in:

$$-\tfrac{1}{2}[\sin((2\pi(2f_e+\delta)/f_s)*I)-\sin(2\pi(\delta/f_s)*I)] \quad (3)$$

The quadrature determination 47 is characterized by first performing a Hilbert transform on the input data block using any of commonly known methods, such as FFT or Filter-based methods. The resultant signal is multiplied by a synthetic signal characterized by:

$$\cos((2\pi*f_e*I/f_s) \quad (4)$$

resulting in:

$$\tfrac{1}{2}[\sin((2\pi(2f_e+\delta)/f_s)*I)+\sin(2\pi(\delta/f_s)*I)] \quad (5)$$

The result of summing equations (3) and (5) is a signal with two components—the "sum" component containing the sum of the estimated $f_e$ and the error of the estimate relative to the actual frequency, and the "difference" component containing the error alone. In theory, the summation function results in:

$$\sin(2\pi(\delta/f_s)I) \quad (6)$$

where the sum component is zero. Filtering 48 is preferred to remove any residual sum components. A smoothing and integration function 49 further enhances the signal-to-noise ratio of the filter output. For small values of $\delta$, the "difference" frequency component can be approximated by a monotonically increasing or decreasing discrimination function (sin(x)=x) 50. A binary search technique 52 is used to refine the down conversion frequency until monotonicity of the discrimination function is embedded in the noise generated by the down conversion process. If $\delta>0$, then the discriminate function is monotonically increasing and $f_e$ is too low and must be increased by some incremental frequency value; if $\delta<0$, then the result is monotonically decreasing and $f_e$ is too high and must be decreased by some incremental frequency value. The signal is continually cycled through the tuning loop until the increment is below some threshold. At that determination, the calculated frequency is the last incremented $f_e$.

Figure 5:
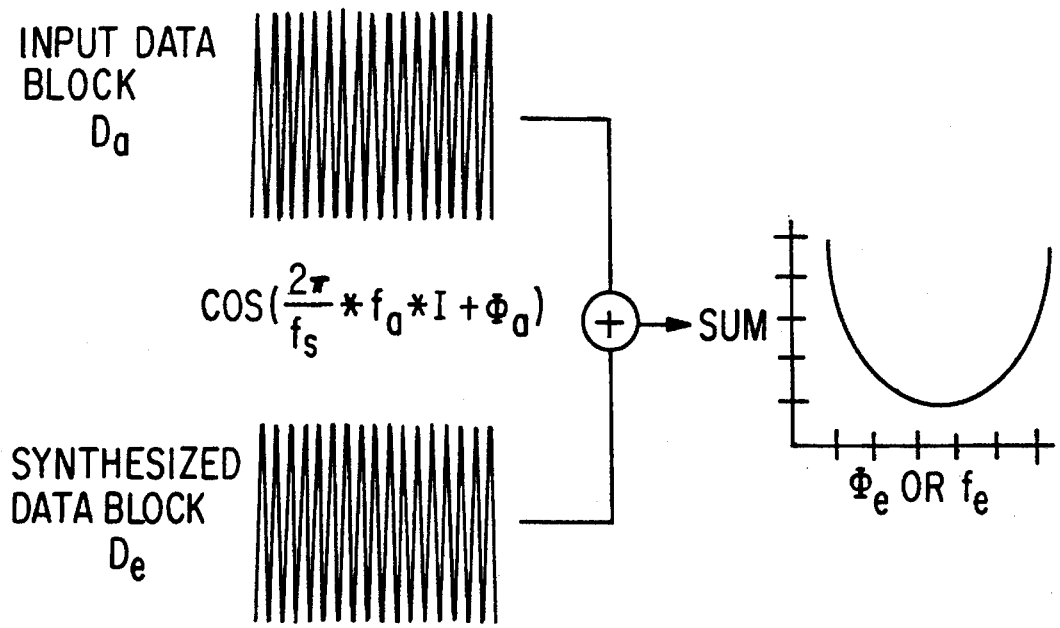
FIG. 5 is a graphical illustration of the result of summing two signals.
Figure 4:
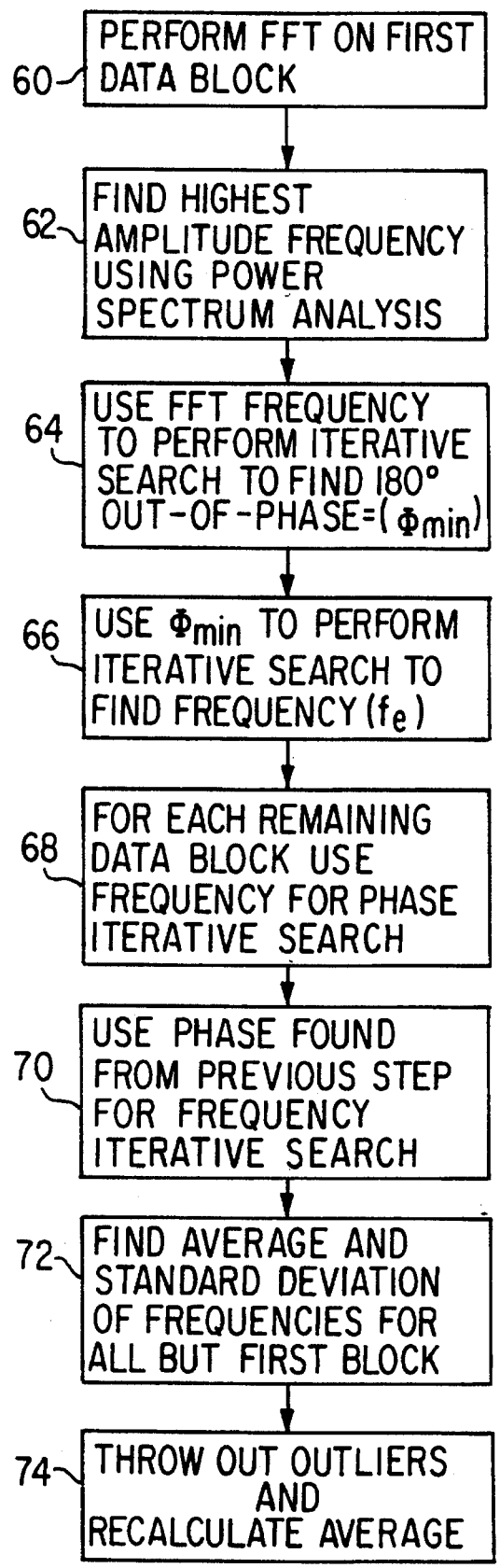
FIG. 4 is a flow diagram of an alternate embodiment for calculating the frequency of continuous wave or wide pulse RF signals.

FIGS. 4 and 5 illustrate an alternate embodiment of the invention. This embodiment takes advantage of the fact that when two RF signals, identical in frequency and magnitude, but differing in phase by 180°, are added together, the result is a 0 signal level.

The acquired data from digitizer 28 is divided into blocks of data points, preferably, between 256 to 1024 data points per block. The first data block is used to derive an initial estimate of the input signal frequency. An FFT is performed on this block 60, and power spectrum analysis 62 of the result yields the frequency used as the starting point, $f_{initial}$, for the iterative phase search 64. The 180° out-of-phase point of the first data block input signal, can be found by synthesizing a signal having an amplitude approximating that of the actual signal and having a frequency $f_{initial}$ and determining the phase at which the sum of the synthesized signal and the actual input signal is minimized, $\Phi_{min}$, as illustrated in FIG. 5. Enough points must be used so that the accuracy of the starting point frequency used in the phase portion of the iterative search does not cause a large error in the phase estimate. A 1024 point FFT yields sufficient accuracy so that the frequency derived from the first data block can be used as the starting point for the remainder of the data blocks. Preferably, if fewer than 1024 points are available in each data block, then for the initial FFT, the remainder of the 1024 points can be zero-filled.

Figure 6:
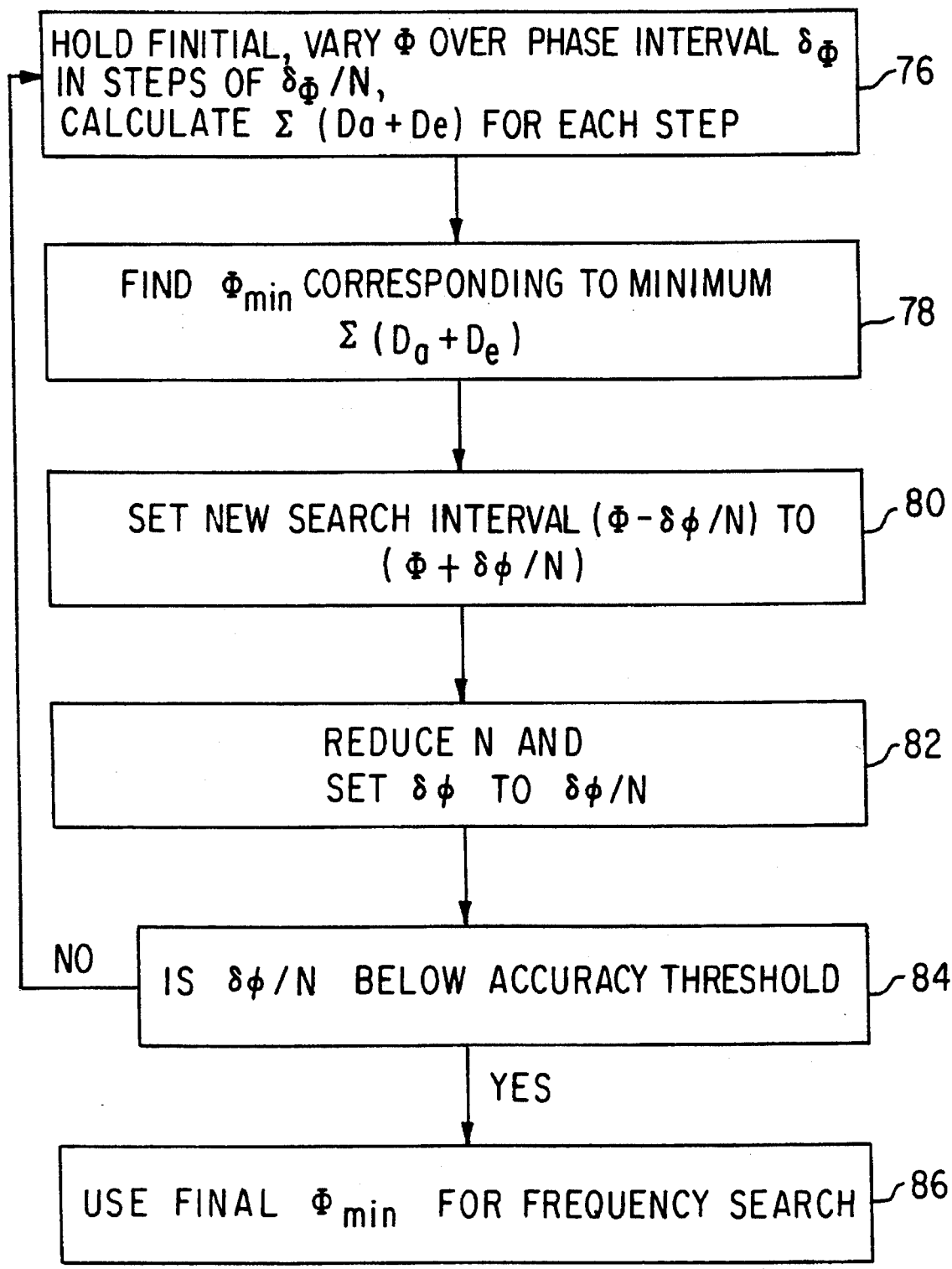
FIG. 6 is a flow diagram for performing an iteration search to locate phase minimum.

FIG. 6 illustrates a preferred iterative phase search method. Holding $f_{initial}$ constant, the phase, $\Phi$, of the synthesized signal is first varied through a search interval $\delta_\Phi$ having a range from 0° to 360° in steps of N degrees 76. The phase, $\Phi_{min}$, is calculated where the minimum sum of the synthesized signal and the input data occurs. In each subsequent step, the search range interval is reduced to [$\Phi_{min}$–step size of previous step] and [$\Phi_{min}$+step size of previous step] 80. Step size N is reduced by some factor, M (typically 4 to 10) 82. This iteration continues until the step size is below some arbitrary accuracy threshold 84 and a final $\Phi_{min}$ is determined for the first data block 86.

Figure 7:
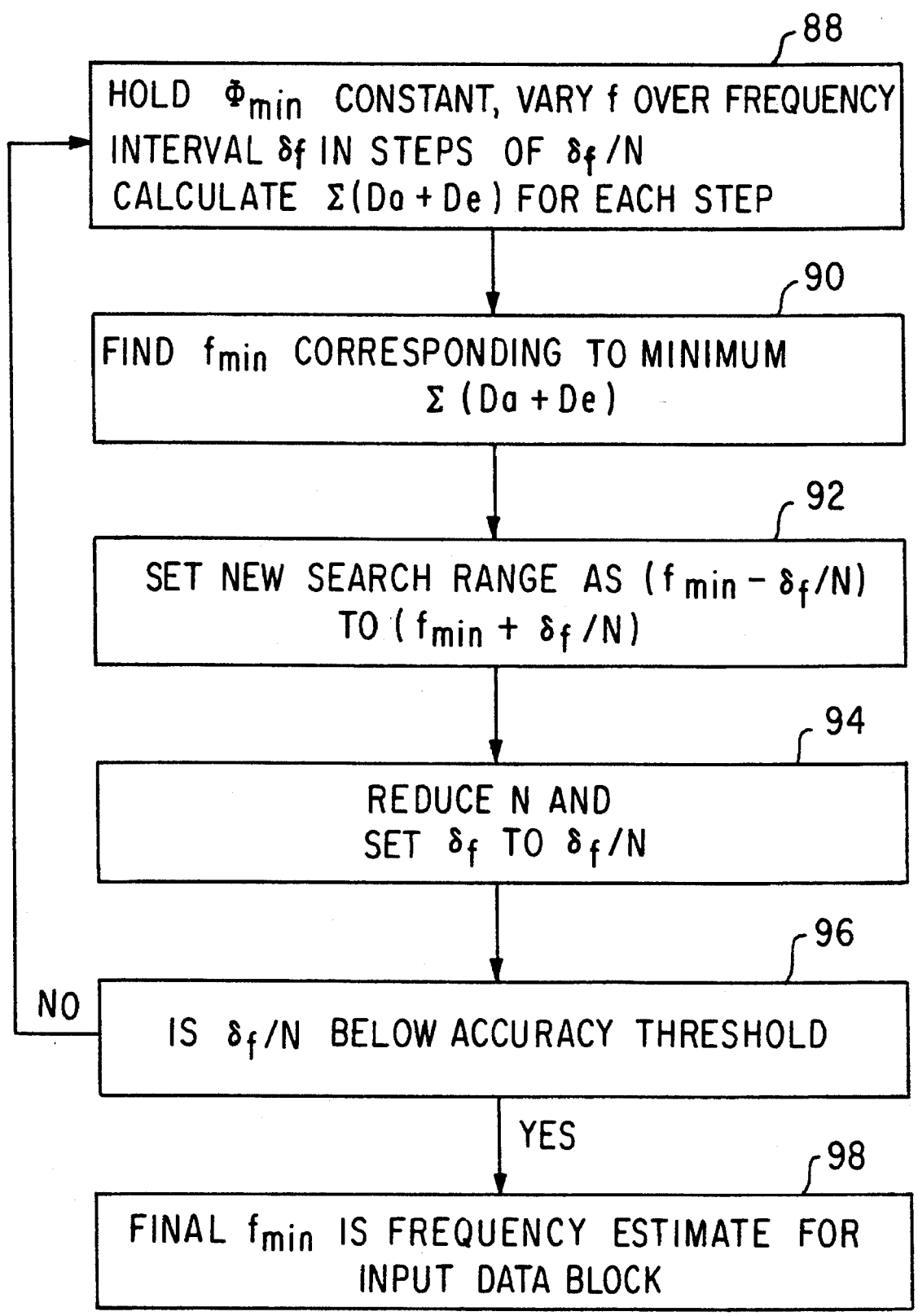
FIG. 7 is a flow diagram for performing an iteration search to determine the frequency for a block of data points.

Referring again to FIG. 4, the phase value, $\Phi_{min}$, is used in the frequency iterative search 66 to calculate the estimated frequency for the first data block as illustrated in FIG. 7. The frequency of the first data block input signal can be found by synthesizing a signal having an amplitude approximating that of the actual signal and having the phase $\Phi_{min}$ and determining the frequency at which the sum of the synthesized signal and the actual input signal is minimized, as illustrated in FIG. 5. Assuming the estimated frequency is in the FFT bin from step 60, the frequency is varied through a search interval $\delta_f$ to cover approximately 1 to 2 FFT bins in steps of N Hz. The frequency at which the minimum sum of the synthesized signal and the input data occurs, $f_{min}$, is then used as the starting point for the next step of the search. In each subsequent step, the interval is reduced to [$f_{min}$−step size of previous step] and [$f_{min}$+step size of previous step] 92. Step size N is reduced by some factor, M (typically from 4 to 10) 94. This iteration continues until the step size is below some arbitrary accuracy threshold and a final $f_{min}$ is determined for the first data block.

The result of the iterative search performed on the first data block, $f_{min}$, is used as the starting frequency for the iterative phase search 68 performed on the remaining data blocks. The $\Phi_{min}$ determined from the iterative phase search is then input into the iterative frequency search 70. A final $f_{min}$ is calculated for each data block. Accuracy may be improved further by using the results of the previous phase/frequency search on a previous data block as the respective phase and frequency inputs to the phase/frequency search on a subsequent data block. The final frequency measurement is the average of the results for all but the first of the data blocks, after the rejection of outliers (where outliers are > than 2 standard deviations) 72 and 74.

It will be understood that the particular embodiments described above are only illustrative of the principles of the present invention, and that various modifications could be made by those skilled in the art without departing from the scope and spirit of the present invention, which is limited only by the claims that follow.

What is claimed is:

1. A method for measuring the frequency of continuous wave or wide pulse RF signals comprising:
   (a) down converting said RF signal to a signal having an intermediate frequency:
   (b) digitizing said intermediate frequency signal;
   (c) dividing said digitized data sample into blocks of discrete data points:
   (d) calculating an estimated frequency for a first data block;
   (e) calculating the frequency of the individual remaining blocks of discrete data points through an iteration process comprising:
      (i) generating a synthetic signal as a function of said estimated frequency and said block of discrete data points under analysis and summing said synthetic signal and said data block under analysis to produce a sum signal;
      (ii) applying a discrimination function to test said sum signal;
      (iii) adding an incremental frequency value to said estimated frequency to create a new estimated frequency;
      (iv) testing said incremental frequency value against a threshold value;
      (v) reducing the magnitude of said incremental frequency value; and
      (vi) repeating steps (i) through (v) using said new estimated frequency if said incremental frequency value is greater than said threshold value;
      wherein the calculated frequency for said individual data block under analysis is said new estimated frequency of (iii) when said incremental frequency value is less than said threshold value; and
   (f) calculating said frequency of said RF signal by averaging said frequencies calculated in (e) for each data block.

2. The method of claim 1 wherein step (i) further comprises the steps:
   (a) generating a first intermediate synthetic signal by multiplying said data block by an in-phase determination characterized by $$\sin((2\pi*f_e*I)/f_s)$$

(c) generating a second intermediate synthetic signal by performing a Hilbert transform on said data block and multiplying the result of said transform by a quadrature determination characterized by $$\cos((2\pi*f_e*I)/f_s)$$

(d) summing said first and second intermediate synthetic signals, wherein said sum signal comprises a sum component and a difference component; and
   (e) filtering out said sum component from said sum signal.

3. The method of claim 2 further comprising omitting all data points preceding the first maximum data point of said block of data points.

4. The method of claim 2 wherein said discrimination function tests whether said sum signal monotonically increases or decreases.

5. The method of claim 1 wherein said discrimination function tests for the minimum value of said sum signal.

6. A method for measuring the frequency of continuous wave or wide pulse RF signals comprising:
   (a) down converting said RF signal to a signal having an intermediate frequency;
   (b) digitizing said intermediate frequency signal;
   (c) dividing said digitized data sample into blocks of discrete data points;
   (d) calculating an initial estimated frequency for said first data block;
   (e) generating a first synthetic signal having an amplitude approximating that of a subsequent block of data points under analysis and having said initial estimated frequency;
   (f) determining the phase angle, called phase minimum, at which the sum of said first synthesized signal and said data points is minimized
   (g) generating a second synthetic signal having an amplitude approximating that of said block of data points under analysis and having phase angle phase minimum;
   (h) determining the frequency, called frequency minimum, at which the sum of said second synthesized signal and said data points is minimized; and
   (i) calculating said frequency of said RF signal by averaging said frequencies calculated in (h) for each data block.

7. The method of claim 6 wherein the step of determining said phase minimum is an interation process comprising the steps of:

(a) varying the phase angle of said first synthetic signal through an interval having a start phase and an end phase in steps of N degrees;

(b) determining the phase angle at which the sum of said first synthesized signal and said data block under analysis is minimized;

(c) reducing said interval and said N value and repeating step (b), wherein said phase minimum is said phase angle determined in (b) when said value N is less than a threshold value.

8. The method of claim 6 wherein the step of determining said frequency minimum is an iteration process comprising the steps of:

(a) varying the frequency of said second synthetic signal through an interval having a start frequency and an end frequency in steps of N Hz;

(b) determining the frequency at which the sum of said second synthesized signal and said data block under analysis is minimized;

(c) reducing said interval and said N value and repeating step (b), wherein said frequency minimum is said frequency determined in (b) when said value N is less than a threshold value.

* * * * *